(12) United States Patent
Kurita (10) Patent No.: US 7,592,692 B2
(45) Date of Patent: Sep. 22, 2009

(54) SEMICONDUCTOR DEVICE WITH A DUMMY ELECTRODE

(75) Inventor: Yoichiro Kurita, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 203 days.

(21) Appl. No.: 11/581,581

(22) Filed: Oct. 17, 2006

(65) Prior Publication Data

US 2007/0090469 A1    Apr. 26, 2007

(30) Foreign Application Priority Data

Oct. 20, 2005    (JP) .................... 2005-306316

(51) Int. Cl.
*H01L 23/02*    (2006.01)
*H01L 23/48*    (2006.01)
(52) U.S. Cl. ............... 257/686; 257/777; 257/E25.006; 257/E25.021; 257/E25.027; 257/E23.085
(58) Field of Classification Search ............ 257/685, 257/686, 777, E25.006, E25.027, E25.085
See application file for complete search history.

(56) References Cited

U.S. PATENT DOCUMENTS 6,075,712 A * 6/2000 McMahon .................... 361/83
6,809,421 B1 * 10/2004 Hayasaka et al. ........... 257/777

FOREIGN PATENT DOCUMENTS

| JP | 08-125120 | 5/1996 | |
| JP | 63-301552 | * 12/1998 | ............. 257/698 |

* cited by examiner

*Primary Examiner*—Jasmine J Clark
(74) *Attorney, Agent, or Firm*—Young & Thompson (57) ABSTRACT

A semiconductor device according to an embodiment of the present invention includes a semiconductor chip. The semiconductor chip includes a semiconductor substrate, an interconnect layer, a back electrode (first working electrode), and a back dummy electrode (first dummy electrode). On the semiconductor substrate, the interconnect layer including an interconnect is provided. On a back surface of the semiconductor substrate, the back electrode is provided in electrical connection to the interconnect. On the back surface, also the back dummy electrode is provided, which is electrically insulated from the interconnect.

13 Claims, 9 Drawing Sheets

SEMICONDUCTOR DEVICE WITH A DUMMY ELECTRODE

This application is based on Japanese patent application No. 2005-306316, the content of which is incorporated hereinto by reference.

BACKGROUND

1. Technical Field

The present invention relates to a semiconductor device.

2. Related Art

Figure 9:
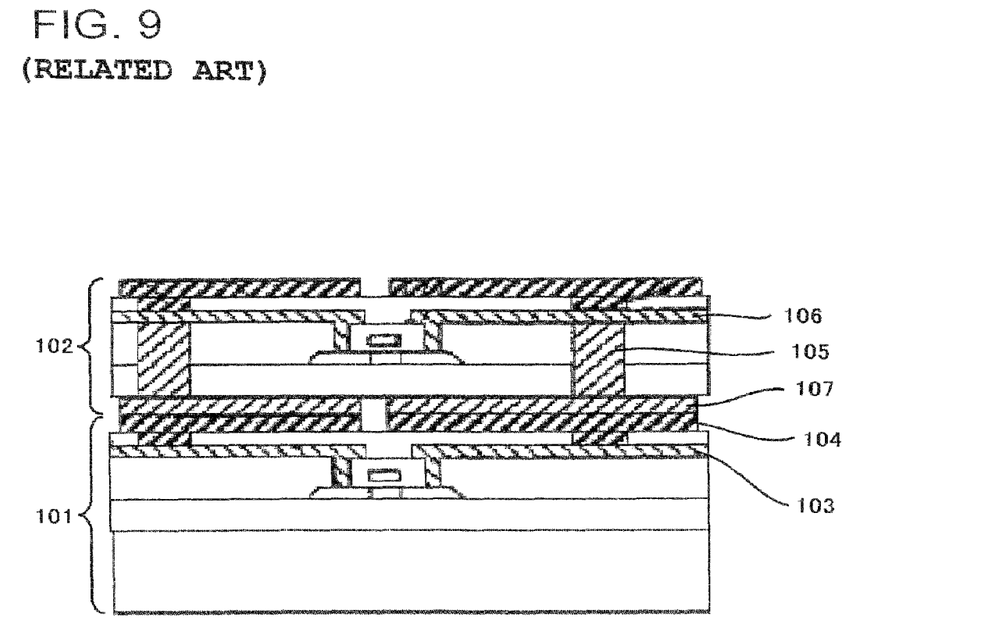
FIG. 9 is a cross-sectional view of a conventional semiconductor device.

Semiconductor devices so far developed include the one disclosed in, for example, Japanese Laid-open patent publication No. H08-125120. The semiconductor device according to the publication is a three-dimensionally integrated semiconductor device including a plurality of semiconductor chips (LSI) stacked on each other. More specifically, as shown in FIG. 9, a semiconductor chip 102 is stacked on a semiconductor chip 101. On the upper surface of the semiconductor chip 101, a plate-shaped electrode 104 is provided, in electrical connection to an interconnect 103 of the semiconductor chip 101. On the back surface of the semiconductor chip 102, a plate-shaped electrode 107 is provided, in electrical connection to an interconnect 106 of the semiconductor chip 102 through a via plug 105 penetrating the semiconductor chip 102. Such electrode 104 and the electrode 107 are mechanically joined, thus constituting the structure in which the semiconductor chip 102 is stacked on the semiconductor chip 101.

SUMMARY OF THE INVENTION

Under such structure, it is preferable to make the electrode 107 as large in area as possible, from the viewpoint of securing sufficient connection strength of the joint portion between the semiconductor chip 101 and the semiconductor chip 102, namely the connection strength between the electrode 104 and the electrode 107. For such purpose, the electrode 107 of the semiconductor device shown in FIG. 9 has a much larger area than the cross-sectional area (taken parallel to the surface of the substrate) of the via plug 105.

Making the electrode 107 thus large in area, however, results in an increase in static capacitance that emerges between the electrode 107 and the semiconductor layer of the semiconductor chip 102. Such increase in static capacitance leads to degradation in electrical characteristics of the semiconductor device.

According to the present invention, there is provided a semiconductor device comprising a semiconductor chip, wherein the semiconductor chip includes: a semiconductor substrate; an interconnect layer including an interconnect, provided on the semiconductor substrate; a first working electrode provided on a back surface of the semiconductor substrate and electrically connected to the interconnect; and a first dummy electrode provided on the back surface of the semiconductor substrate and electrically insulated from the interconnect.

In the semiconductor device thus constructed, the first working electrode and the first dummy electrode are provided on the back surface of the semiconductor substrate. Accordingly, when stacking a plurality of semiconductor chips on each other, not only the first working electrode but also the first dummy electrode can serve as the joint portion between the semiconductor chips. Such structure, therefore, allows securing sufficient connection strength of the joint portion, without increasing the area of the first working electrode.

Thus, the present invention provides a semiconductor device that assures reliable connection between semiconductor chips, while preventing degradation in electrical characteristics.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an exemplary embodiment of a semiconductor device according to the present invention will be described, referring to the accompanying drawings. In all the drawings, same constituents are given the same numerals, and the description thereof will not be repeated.

FIRST EMBODIMENT

Figure 1:
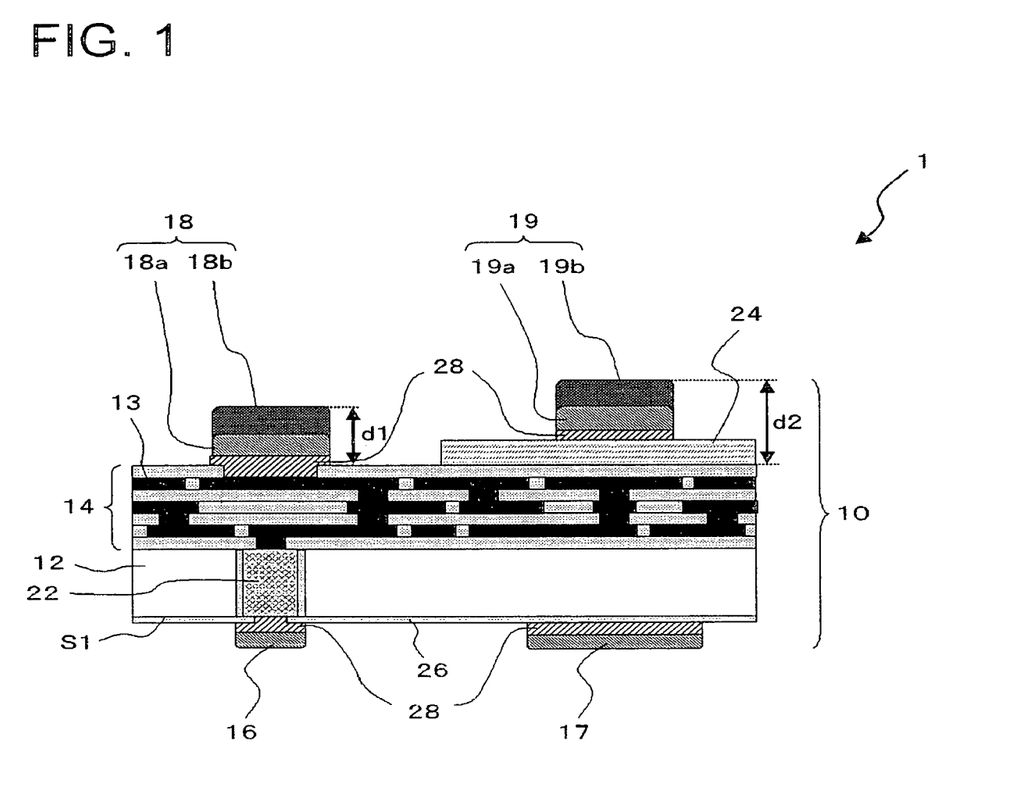
FIG. 1 is a cross-sectional view of a semiconductor device according to the first embodiment of the present invention.

FIG. 1 is a cross-sectional view of a semiconductor device according to the first embodiment of the present invention. The semiconductor device 1 includes a semiconductor chip 10. The semiconductor chip 10 includes a semiconductor substrate 12, an interconnect layer 14, a back electrode 16 (first working electrode), and a back dummy electrode 17 (first dummy electrode). The semiconductor substrate 12 may be a silicon substrate, for example.

On the semiconductor substrate 12, the interconnect layer 14 including an interconnect 13 is provided. On the back surface S1 (the surface on the other side of the interconnect layer 14) of the semiconductor substrate 12, the back electrode 16 is provided, in electrical connection to the interconnect 13. To be more detailed, the back electrode 16 is connected to the interconnect 13 through a via plug 22 penetrating the semiconductor substrate 12. The via plug 22 has an end portion connected to the interconnect 13, and the other end portion exposed in the back surface S1 of the semiconductor substrate 12. In this embodiment, the back electrode 16 is provided only in the region where the via plug 22 is exposed, on the back surface S1.

Here, the back electrode 16 may be constituted of a single metal layer, or a plurality of metal layers. In the former case, the back electrode 16 may be constituted of a Cu layer, for example. In the latter case, the back electrode 16 may be constituted of, for example, stacked layers composed of a Cu layer and a Ni layer, from the side of the semiconductor substrate 12.

On the back surface S1 of the semiconductor substrate 12, the back dummy electrode 17 is also provided. In this embodiment, the back dummy electrode 17 has the same layer structure as that of the back electrode 16. On the other hand, the back dummy electrode 17 is different from the back electrode 16 because of being electrically insulated from the interconnect 13, while the latter is electrically connected to the interconnect 13. The back dummy electrode 17 is not electrically connected to any interconnect in the interconnect layer 14. In other words, the back dummy electrode 17 is electrically insulated from the interconnect region of the interconnect layer 14. The interconnect region herein collectively represents the entirety of the interconnect 13 included in the interconnect layer 14. Also, the back dummy electrode 17 is located on the back surface S1 via an insulating layer 26. The insulating layer 26 has an opening in a region on the back surface S1 where the via plug 22 is exposed. It is through the opening that the back electrode 16 and the via plug 22 are electrically connected to each other.

Comparing the areas in a plan view (i.e. the area of a cross-section taken parallel to the substrate surface of the semiconductor substrate 12) of the back electrode 16 and the back dummy electrode 17, the back electrode 16 has a smaller area than the back dummy electrode 17.

On the interconnect layer 14, a surface electrode 18 (second working electrode) and a surface dummy electrode 19 (second dummy electrode) are provided. The surface electrode 18 is located so as to overlap with the back electrode 16 in a plan view, and is electrically connected to the interconnect 13, as the back electrode 16. On the other hand, the surface dummy electrode 19 is located so as to overlap with the back dummy electrode 17 in a plan view, and is electrically insulated from the interconnect 13, as the back dummy electrode 17. The surface dummy electrode 19 is not electrically connected to any interconnect in the interconnect layer 14, either.

The surface electrode 18 is composed of a base portion 18a and a solder layer 18b formed on the base portion 18a. The base portion 18a may be constituted of a single metal layer, or a plurality of metal layers. In the former case, the base portion 18a may be constituted of a Cu layer, for example. In the latter case, the base portion 18a may be constituted of, for example, stacked layers composed of a Cu layer and a Ni layer, from the side of the interconnect layer 14. An electrode including solder exposed in a surface thereof, like the surface electrode 18 thus configured, will herein be called a solder electrode. Naturally, the entirety of the surface electrode 18 may be constituted of the solder, in which case also the surface electrode 18 is referred to as a solder electrode.

Comparing the areas in a plan view of the back electrode 16 and the surface electrode 18, the back electrode 16 has a smaller area than the surface electrode 18.

In this embodiment, the surface dummy electrode 19 has the same layer structure as that of the surface electrode 18. Specifically, the surface dummy electrode 19 is composed of a base portion 19a and a solder layer 19b formed on the base portion 19a. The surface dummy electrode 19 is located on the interconnect layer 14 via an insulating layer 24 (spacer).

Accordingly, the height d2 of the upper surface of the surface dummy electrode 19 from the interconnect layer 14 is higher than the height d1 of the upper surface of the surface electrode 18 from the interconnect layer 14. Preferably, the insulating layer 24 may be an organic insulating layer.

The foregoing electrodes 16, 17, 18, 19 are provided on the semiconductor substrate 12 or the interconnect layer 14, via an adhesion layer 28. The adhesion layer 28 may be a Ti layer for example. However, providing the adhesion layer 28 is not indispensable. Especially when the electrodes 16, 17, 18, 19 have a multilayer structure composed of a Cu layer and a Ni layer, the electrodes and the semiconductor substrate 12 or the interconnect layer 14 can attain sufficient adhesion, without the intermediation of the adhesion layer 28.

Figure 2A:
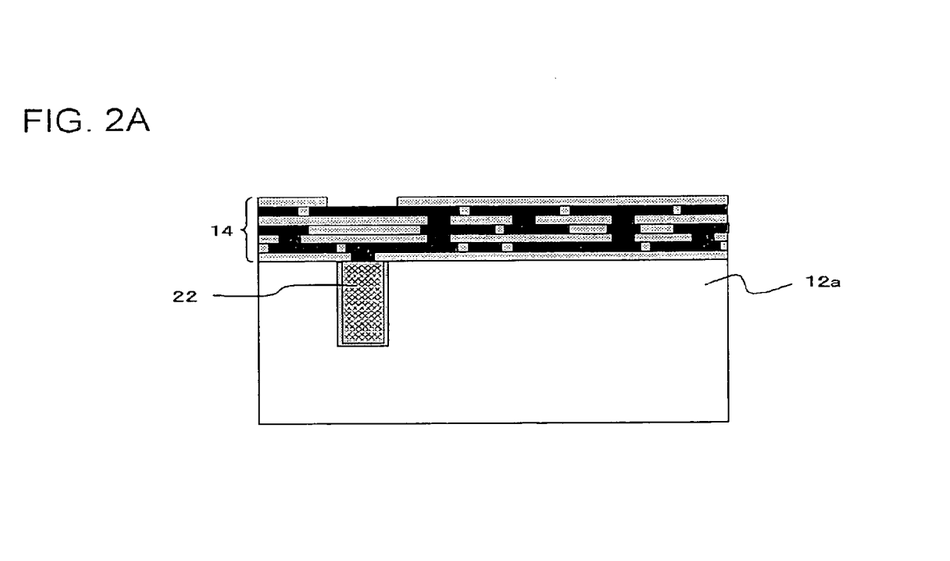
FIGS. 2A and 2B are cross-sectional views sequentially showing a manufacturing process of the semiconductor device shown in FIG. 1.
Figure 2B:
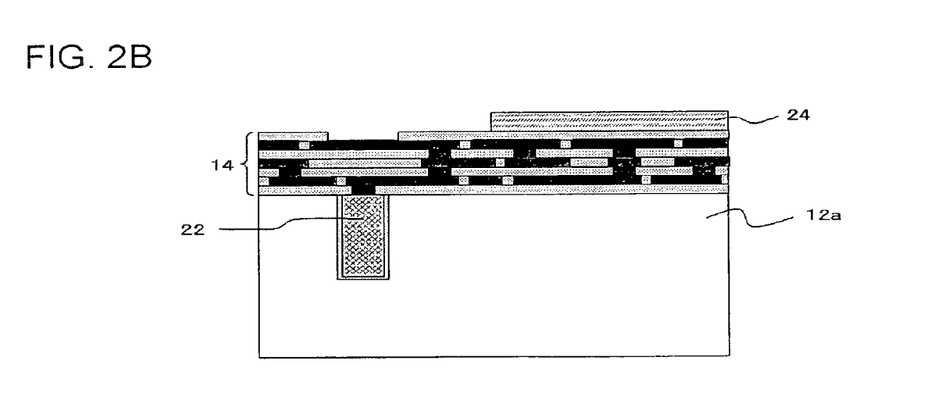

Referring to FIGS. 2A to 4, a method of manufacturing the semiconductor device 1 will be described. Firstly the via plug 22 is formed on the semiconductor substrate 12a, for example a silicon substrate, after which the interconnect layer 14 is formed on the semiconductor substrate 12a. In this process, an opening is formed in an uppermost insulating layer of the interconnect layer 14 at a position where the surface electrode 18 is to be located (FIG. 2A). Then the insulating layer 24 is formed on the interconnect layer 14 (FIG. 2B).

Figure 3A:
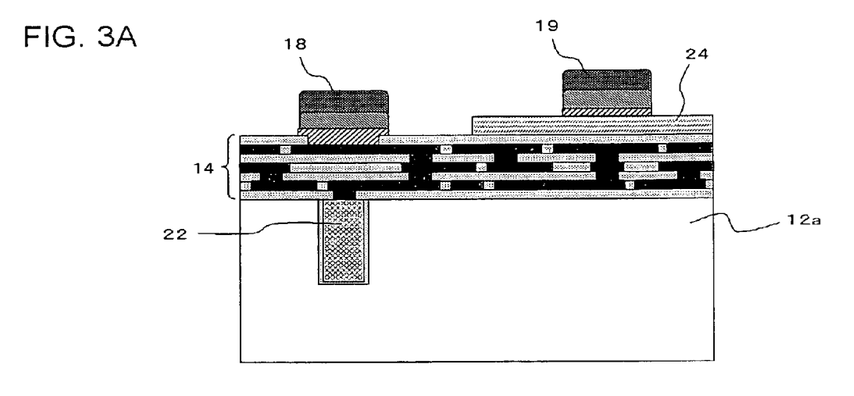
FIGS. 3A and 3B are cross-sectional views sequentially showing a manufacturing process of the semiconductor device shown in FIG. 1.
Figure 3B:
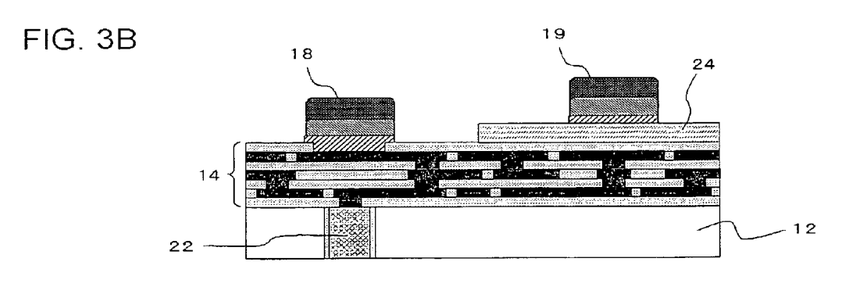
Figure 4:
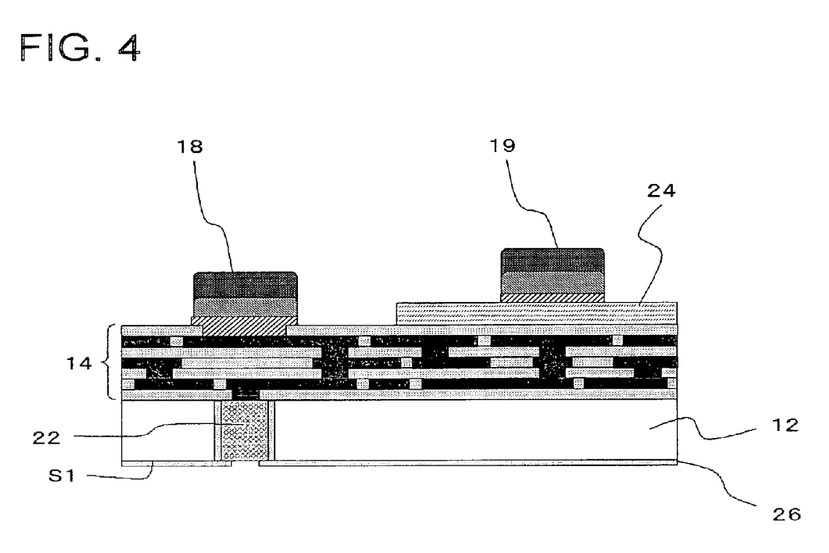
FIG. 4 is a cross-sectional view showing a manufacturing process of the semiconductor device shown in FIG. 1.

A plating process or the like is then performed so as to form the surface electrode 18 and the surface dummy electrode 19 on the interconnect layer 14 (FIG. 3A). After that, the semiconductor substrate 12a is ground until the via plug 22 is exposed. At this stage, the semiconductor substrate 12 is obtained (FIG. 3B). Then the insulating layer 26 is formed on the back surface S of the semiconductor substrate 12. In this process, an opening is formed in a part (the part located on the via plug 22) of the insulating layer 26 (FIG. 4).

After that, back electrode 16 and the back dummy electrode 17 are formed on the back surface S1 of the semiconductor substrate 12, by plating or the like. At this stage, the semiconductor device 1 as shown in FIG. 1 is obtained.

The semiconductor device 1 offers the following advantageous effects. In the semiconductor device 1, the back dummy electrode 17, as well as the back electrode 16, is provided on the back surface S1 of the semiconductor substrate 12. Accordingly, when stacking a plurality of semiconductor chips on each other, not only the back electrode 16 but also the back dummy electrode 17 can serve as the joint portion between the semiconductor chips. Such structure allows securing sufficient connection strength of the joint portion, without increasing the area of the back electrode 16. Therefore, the static capacitance that may emerge between the back electrode 16 and the semiconductor substrate 12 can be prevented from increasing. Thus, the semiconductor device 1 according to the above embodiment assures reliable connection between the semiconductor chips, while preventing degradation in electrical characteristics.

In this embodiment in particular, the back electrode 16 is formed in a small size similar to the diameter of the via plug 22. In other words, the back electrode 16 is located only in a region where the via plug 22 is exposed, on the back surface S1 of the semiconductor substrate 12. Such structure fundamentally suppresses emergence of the static capacitance.

The back electrode 16 is smaller in area than the back dummy electrode 17, in a plan view. Making thus the back dummy electrode 17 relatively larger in area further assures the secure connection between the semiconductor chips. Since the back dummy electrode 17 is electrically insulated from the interconnect 13, increasing the area thereof does not make any difference in the electrical characteristics of the semiconductor device 1. It is to be noted, however, that making the back electrode 16 smaller in area than the back dummy electrode 17 is not mandatory.

The semiconductor chip 10 includes the surface electrode 18 and the surface dummy electrode 19. Accordingly, the semiconductor chip 10 can be electrically connected to another semiconductor chip not only on the side of the semiconductor substrate 12 but also on the side of the interconnect layer 14. However, it is not mandatory to provide the surface electrode 18 and the surface dummy electrode 19 on the semiconductor chip 10.

The upper surface of the surface dummy electrode 19 is at a higher level than the upper surface of the surface electrode 18, from the interconnect layer 14. Such configuration prevents formation of an excessively narrow gap between the surface electrode 18 and an electrode connected thereto, when another semiconductor chip is stacked on the side of the interconnect layer 14 of the semiconductor chip 10. The excessively narrow gap would disturb injection of an underfill resin into the space between the semiconductor chips.

Figure 5:
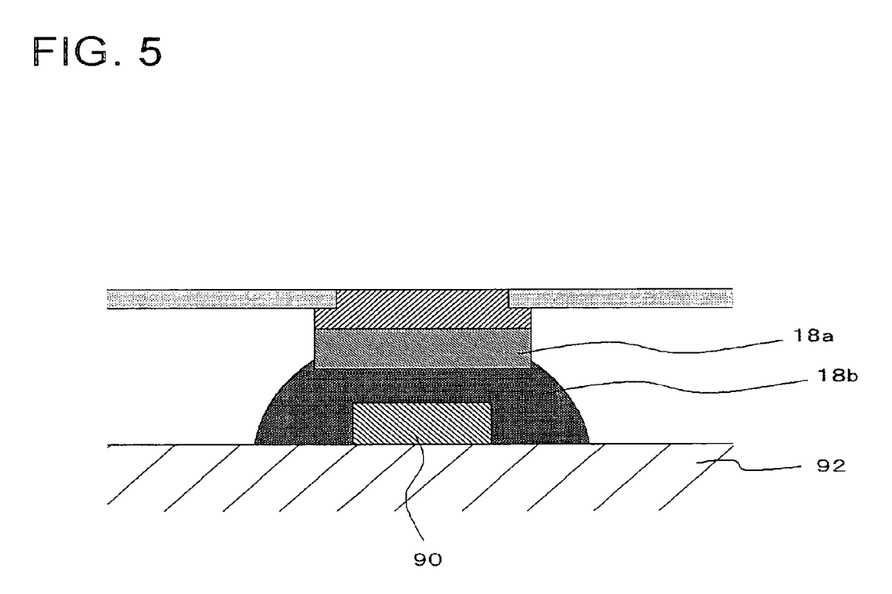
FIG. 5 is a cross-sectional view for explaining the advantageous effect of the manufacturing method of the semiconductor device shown in FIG. 1.

Further, in the case where the gap is excessively narrow, when connecting the surface electrode 18 of the semiconductor chip 10 to an electrode 90 of another semiconductor chip, the melted solder of the solder layer 18b may overflow from the space between those electrodes, as shown in FIG. 5. This leads to emergence of static capacitance between the solder that has overflowed and a semiconductor substrate 92 of the mating semiconductor chip (with an insulating layer, which is not shown, on its surface). Especially when stacking a plurality of semiconductor chips 10, the solder is more prone to overflow because the back electrode 16, which is small in area, acts as the electrode 90. In this aspect, since the semiconductor device 1 allows securing a sufficient gap between the surface electrode 18 and the electrode 90, the emergence of the static capacitance can be prevented.

The surface dummy electrode 19 is provided on the interconnect layer 14 via the insulating layer 24 serving as a spacer. Such structure readily achieves the structure in which the upper surface of the surface dummy electrode 19 is higher than the upper surface of the surface electrode 18. The spacer may be constituted of a conductive layer instead of the insulating layer 24, however employing the insulating layer better facilitates the formation of the spacer. It should be noted, however, that locating the upper surface of the surface dummy electrode 19 at a higher level than the upper surface of the surface electrode 18 is not mandatory, and hence providing the spacer on the semiconductor chip 10 is not mandatory, either.

Employing an organic insulating layer to form the insulating layer 24 facilitates forming the insulating layer 24 in a greater thickness, as compared with employing an inorganic insulating layer.

The back electrode 16 is smaller in area than the surface electrode 18 in a plan view. Making thus the surface electrode 18 relatively larger in area further assures the secure connection between the semiconductor chip 10 and another semiconductor chip stacked thereon on the side of the interconnect layer 14. However, making the back electrode 16 smaller in area than the surface electrode 18 is not mandatory.

The surface electrode 18 and the surface dummy electrode 19 are constituted of the solder electrode. The connection of the semiconductor chip 10 and another semiconductor chip can be easily executed, simply by melting the solder of the solder electrode for the connection. Here, the solder layer may be provided only on the back electrode 16 out of the back electrode 16 and the surface electrode 18, or on both thereof.

This also applies to the dummy electrode, and the solder layer may be provided only on the back dummy electrode 17 out of the back dummy electrode 17 and the surface dummy electrode 19, or on both thereof.

SECOND EMBODIMENT

Figure 6:
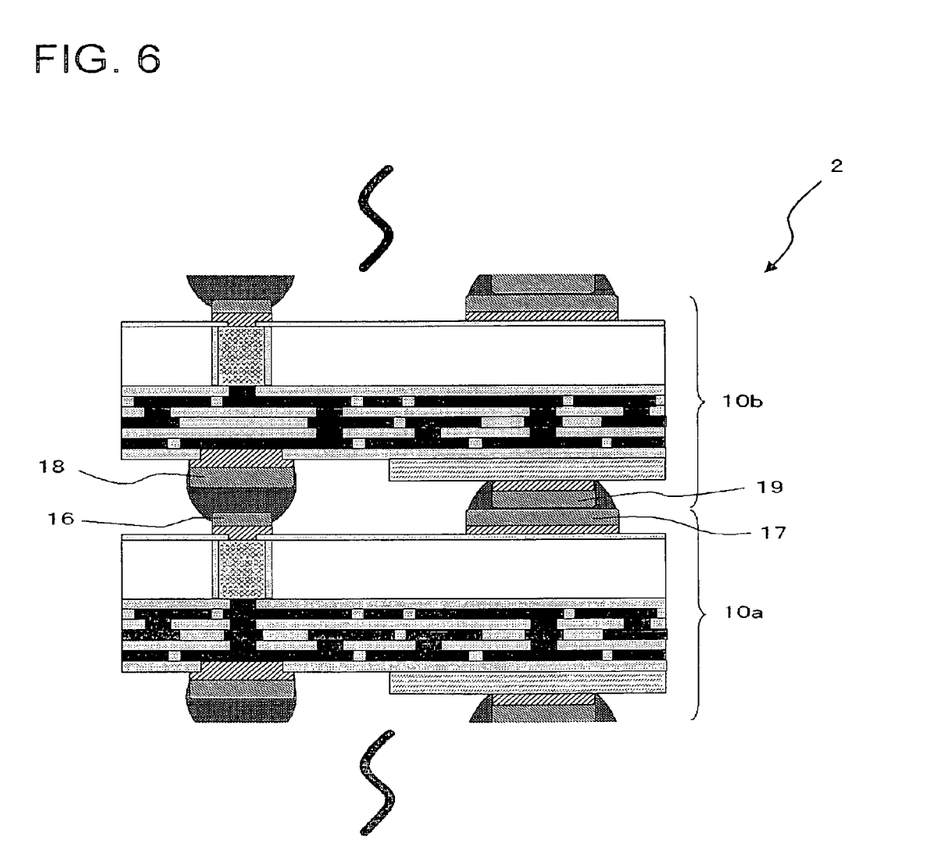
FIG. 6 is a cross-sectional view of a semiconductor device according to the second embodiment of the present invention.

FIG. 6 is a cross-sectional view of a semiconductor device according to the second embodiment of the present invention. The semiconductor device 2 is a three-dimensionally integrated semiconductor device, and includes a plurality of semiconductor chips, such as the semiconductor chips 10a, 10b. The structure of the semiconductor chips 10a, 10b is similar to that of the semiconductor chip 10 shown in FIG. 1. The plurality of semiconductor chips is stacked on each other. As to the two semiconductor chips 10a, 10b disposed adjacent to each other, the back electrode 16 and the back dummy electrode 17 of one of the semiconductor chips 10a are respectively connected to the surface electrode 18 and the surface dummy electrode 19 of the other semiconductor chip 10b.

The connection of the semiconductor chips 10a, 10b may be achieved by connecting the surface electrode 18 and the surface dummy electrode 19 of the semiconductor chip 10b to the back electrode 16 and the back dummy electrode 17 of the semiconductor chip 10a respectively, with the solder layers on the semiconductor chip 10b (solder layers 18b, 19b shown in FIG. 1) melted.

The semiconductor device 2 thus constructed offers the following advantageous effect, in addition to those offered by the semiconductor device 1. The semiconductor device 2 includes a plurality of semiconductor chips 10a, 10b of the same structure, stacked on each other. Accordingly, the semiconductor device 2 can be attained by stacking on each other a plurality of semiconductor chips obtainable from the same wafer. Thus, the above embodiment provides the three-dimensionally integrated semiconductor device 2 that can be manufactured under high production efficiency.

Figure 7:
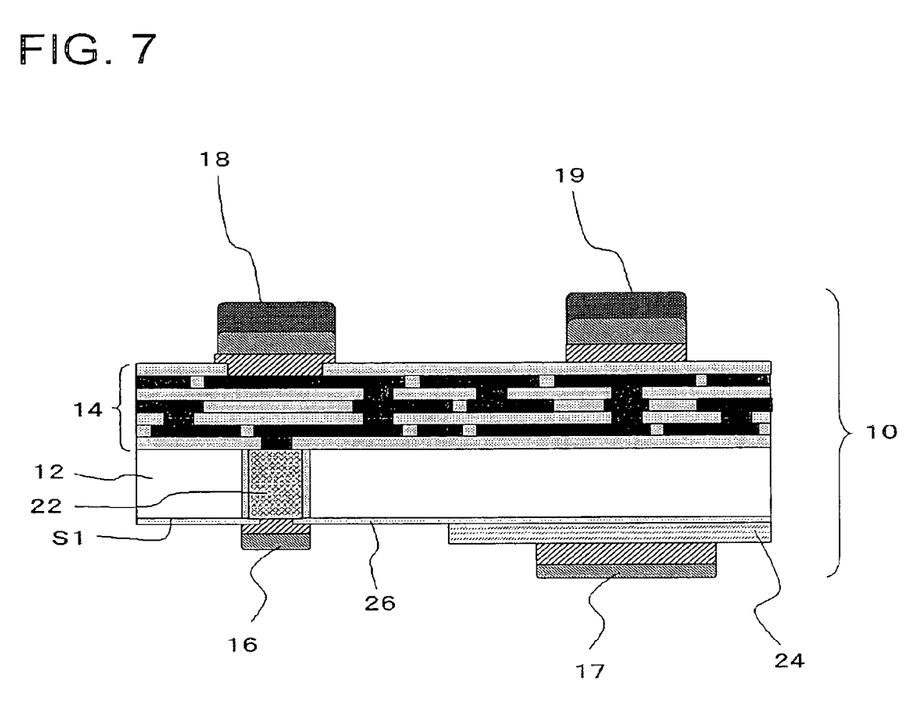
FIG. 7 is a cross-sectional view of the semiconductor device according to a variation of the embodiment.
Figure 8:
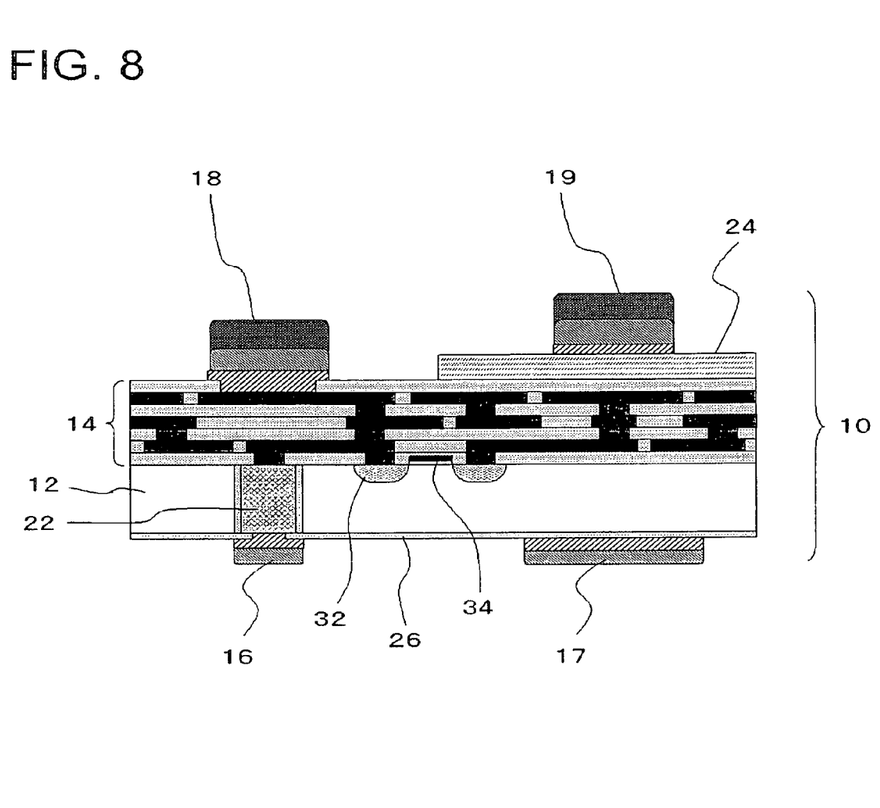
FIG. 8 is a cross-sectional view of the semiconductor device according to another variation of the embodiment.

The semiconductor device according to the present invention is not limited to the foregoing embodiments, but various modifications may be made. To cite a few examples, although the insulating layer 24 is provided on the interconnect layer 14 according to the embodiments, the insulating layer 24 may be provided on the back surface S1 of the semiconductor substrate 12, as shown in FIG. 7. Also as shown in FIG. 8, semiconductor elements such as a transistor may be provided in the semiconductor chip 10. In FIG. 8, the semiconductor chip 10 includes a transistor mainly constituted of a source/drain region 32 formed in the semiconductor substrate 12 and a gate electrode 34 formed in the interconnect layer 14.

It is apparent that the present invention is not limited to the above embodiment, and may be modified and changed without departing from the scope and spirit of the invention.

What is claimed is:

1. A semiconductor device comprising a semiconductor chip,
   wherein said semiconductor chip includes:
   a semiconductor substrate; an interconnect layer including an interconnect, provided on said semiconductor substrate;
   a first working electrode provided on a back surface of said semiconductor substrate and electrically connected to said interconnect;
   a first dummy electrode provided on said back surface of said semiconductor substrate and electrically insulated from said interconnect;

a second working electrode provided on said interconnect layer and electrically connected to said interconnect; and a second dummy electrode provided on said interconnect layer and electrically insulated from said interconnect.

2. The semiconductor device according to claim 1, wherein an upper surface of said second dummy electrode is at a higher level than an upper surface of said second working electrode, from said interconnect layer.

3. The semiconductor device according to claim 2, wherein said second dummy electrode is provided on said interconnect layer via a spacer.

4. The semiconductor device according to claim 3, wherein said spacer is an insulating layer.

5. The semiconductor device according to claim 4, wherein said insulating layer is an organic insulating layer.

6. The semiconductor device according to claim 1, wherein said first working electrode is smaller in area than said second working electrode, in a plan view.

7. The semiconductor device according to claim 1, wherein said first or said second working electrode is a solder electrode.

8. The semiconductor device according to claim 1, comprising a plurality of said semiconductor chips, wherein said semiconductor chips are stacked on each other; and two of said semiconductor chips disposed adjacent to each other are connected so that said first working electrode and said first dummy electrode of one of said two semiconductor chips are respectively connected to said second working electrode and said second dummy electrode of the other of said two semiconductor chips.

9. A semiconductor device comprising a semiconductor chip,
wherein said semiconductor chip includes:
a semiconductor substrate; an interconnect layer including an interconnect, provided on said semiconductor substrate;
a first working electrode provided on a back surface of said semiconductor substrate and electrically connected to said interconnect; and
a first dummy electrode provided on said back surface of said semiconductor substrate and electrically insulated from said interconnect,
and wherein said first working electrode is smaller in area than said first dummy electrode, in a plan view.

10. The semiconductor device according to claim 9, wherein the first working electrode and the first dummy electrode each comprise at least one layer.

11. The semiconductor device according to claim 10, wherein the first working electrode and the first dummy electrode each comprise a multilayer including a layer of at least one of Ti, Cu or Ni.

12. The semiconductor device according to claim 9, wherein the first working electrode and the first dummy electrode each include an adhesion layer.

13. The semiconductor device according to claim 12, wherein the adhesion layer is formed from Ti.

* * * * *